United States Patent
Schoen et al.

(10) Patent No.: US 9,758,369 B2
(45) Date of Patent: Sep. 12, 2017

(54) METHOD FOR MANUFACTURING A MICROPHONE STRUCTURE AND A PRESSURE SENSOR STRUCTURE IN THE LAYER STRUCTURE OF A MEMS ELEMENT

(71) Applicant: Robert Bosch GmbH, Stuttgart (DE)

(72) Inventors: Florian Schoen, Altdorf (DE); Bernhard Gehl, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/098,462

(22) Filed: Apr. 14, 2016

(65) Prior Publication Data
US 2016/0304336 A1    Oct. 20, 2016

(30) Foreign Application Priority Data

Apr. 16, 2015    (DE) .......................... 10 2015 206 863

(51) Int. Cl.
*H01L 33/02*    (2010.01)
*B81B 7/02*    (2006.01)
(Continued)

(52) U.S. Cl.
CPC ............ *B81B 7/02* (2013.01); *B81C 1/00214* (2013.01); *G01L 1/148* (2013.01); *G01L 9/12* (2013.01); *H04R 19/005* (2013.01); *H04R 19/04* (2013.01); *H04R 31/00* (2013.01); *B81B 2201/0257* (2013.01); *B81B 2201/0264* (2013.01);
(Continued)

(58) Field of Classification Search
None
See application file for complete search history.

(56) References Cited

U.S. PATENT DOCUMENTS 5,894,452 A * 4/1999 Ladabaum ............ B06B 1/0292
367/163
6,870,938 B2 * 3/2005 Takeuchi ................. H04R 1/04
381/113
(Continued)

FOREIGN PATENT DOCUMENTS

WO    2012/122872 A1    9/2012

*Primary Examiner* — Michael Lebentritt
(74) *Attorney, Agent, or Firm* — Gerard A. Messina; Norton Rose Fulbright US LLP

(57) ABSTRACT

A manufacturing method for a MEMS element, by which both a microphone including a microphone capacitor and a pressure sensor including a measuring capacitor are implemented in the MEMS structure. The components of the microphone and pressure sensor are formed in parallel but independently in the layers of the MEMS structure. The pressure sensor diaphragm is structured from a first layer, which functions as a base layer for the microphone diaphragm. The fixed counter-electrode of the measuring capacitor is structured from an electrically conductive second layer which functions as a diaphragm layer of the microphone. The fixed pressure sensor counter-element is structured from third and fourth layers. The third layer functions in the area of the microphone structure as a sacrificial layer, the thickness of which in the area of the microphone structure determines the electrode distance of the microphone capacitor. The microphone counter-element is structured from the fourth layer.

6 Claims, 11 Drawing Sheets

(51) Int. Cl.
  *G01L 9/12* (2006.01)
  *H04R 19/04* (2006.01)
  *B81C 1/00* (2006.01)
  *G01L 1/14* (2006.01)
  *H04R 19/00* (2006.01)
  *H04R 31/00* (2006.01)

(52) U.S. Cl.
  CPC .  *B81B 2203/0127* (2013.01); *B81C 2201/013* (2013.01); *B81C 2201/0109* (2013.01); *H04R 2201/003* (2013.01)

(56) References Cited

U.S. PATENT DOCUMENTS

| | | | |
|---|---|---|---|
| 8,229,139 B2* | 7/2012 | Pahl | B81B 7/0064 |
| | | | 381/122 |
| 8,327,711 B2* | 12/2012 | Kasai | H04R 19/005 |
| | | | 73/649 |
| 9,187,317 B2 | 11/2015 | Cheng et al. | |
| 2009/0026561 A1* | 1/2009 | Reichenbach | B81C 1/00182 |
| | | | 257/416 |
| 2010/0275675 A1* | 11/2010 | Seppa | G01L 9/0041 |
| | | | 73/24.01 |
| 2011/0103622 A1* | 5/2011 | Weigold | H04R 3/00 |
| | | | 381/174 |
| 2011/0241137 A1* | 10/2011 | Huang | B81C 1/00246 |
| | | | 257/419 |
| 2011/0311081 A1* | 12/2011 | Kim | B81B 7/0016 |
| | | | 381/174 |
| 2013/0126991 A1* | 5/2013 | Ehrenpfordt | H01L 29/66007 |
| | | | 257/416 |
| 2013/0322675 A1* | 12/2013 | Zoellin | H04R 1/04 |
| | | | 381/355 |
| 2014/0264653 A1 | 9/2014 | Cheng et al. | |
| 2014/0264662 A1 | 9/2014 | Cheng et al. | |
| 2015/0001653 A1* | 1/2015 | Schelling | B81C 1/00158 |
| | | | 257/419 |
| 2015/0014797 A1* | 1/2015 | Schelling | B81B 3/0059 |
| | | | 257/416 |
| 2015/0063608 A1* | 3/2015 | Schelling | H04R 19/005 |
| | | | 381/174 |
| 2015/0256917 A1* | 9/2015 | Schelling | H04R 1/08 |
| | | | 381/111 |
| 2016/0280534 A1* | 9/2016 | Stahl | B81B 3/0086 |

* cited by examiner

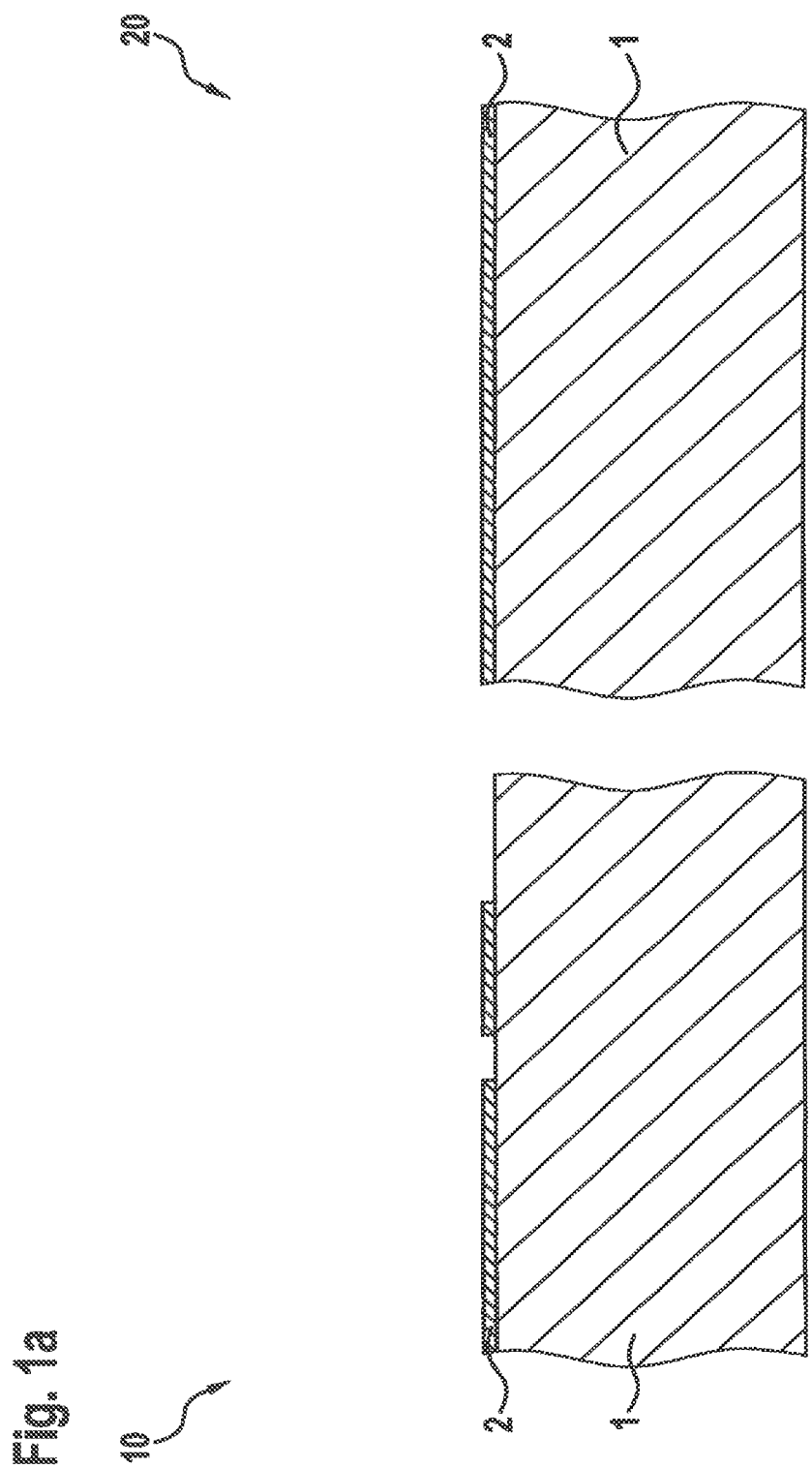

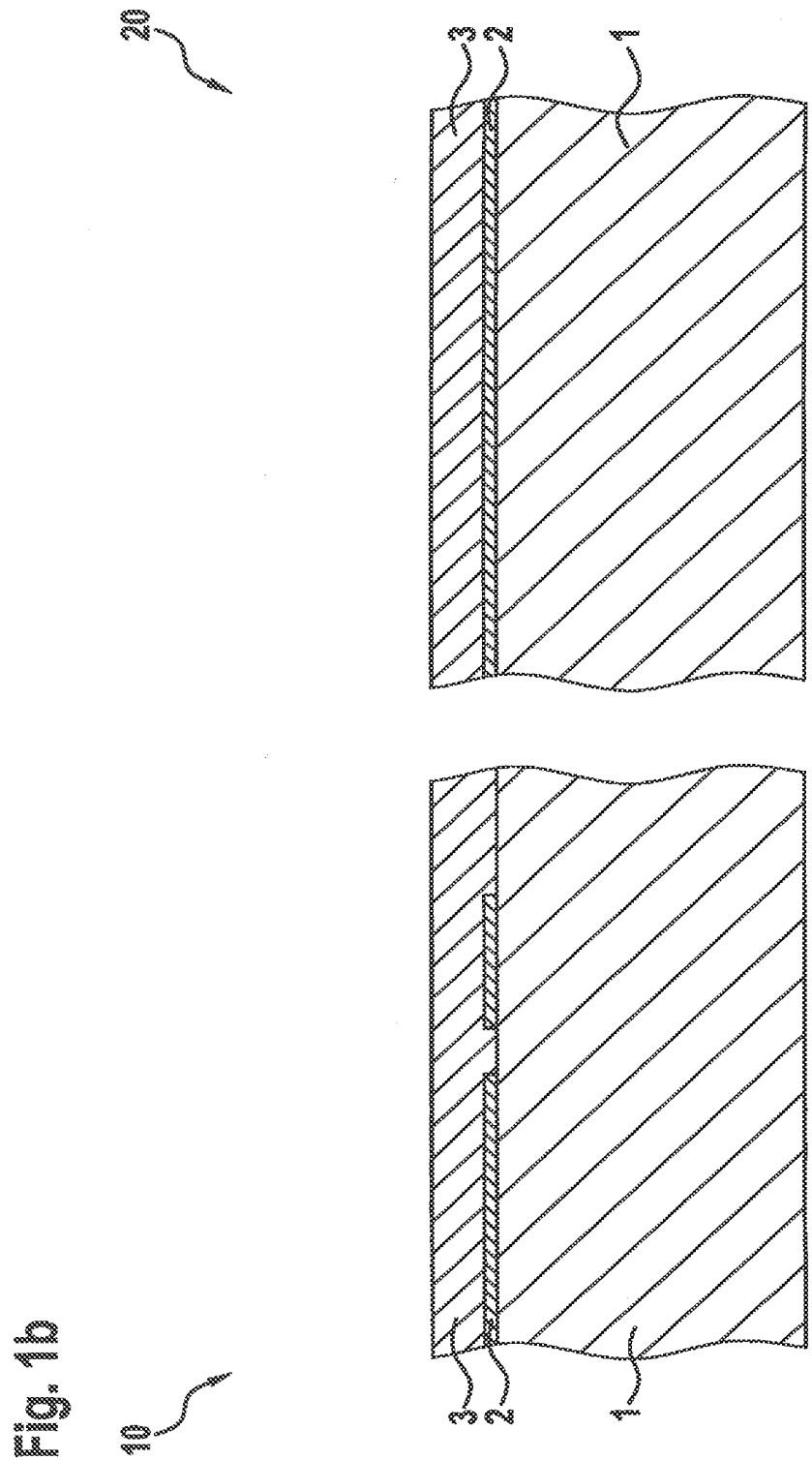

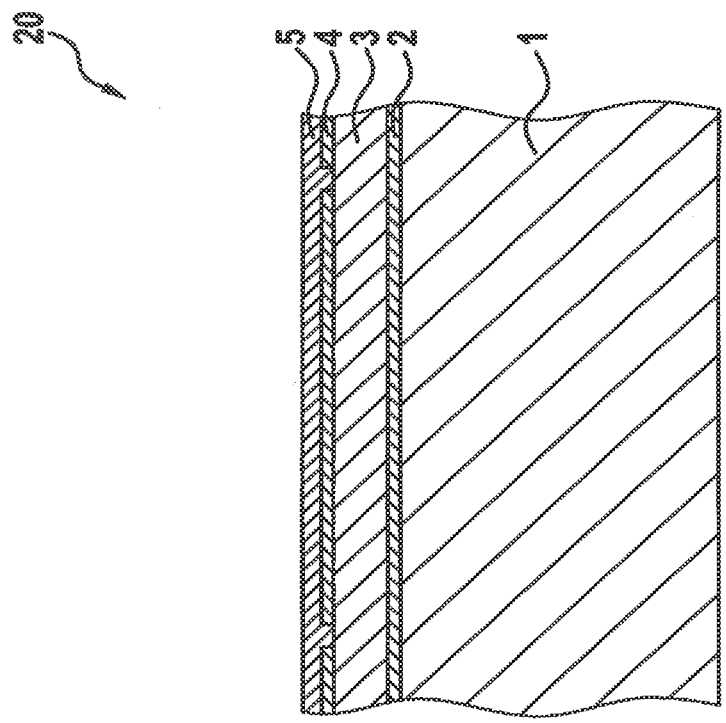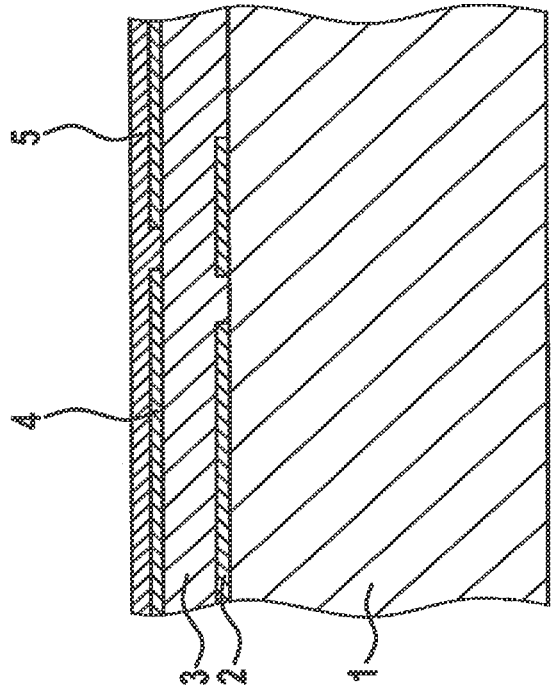

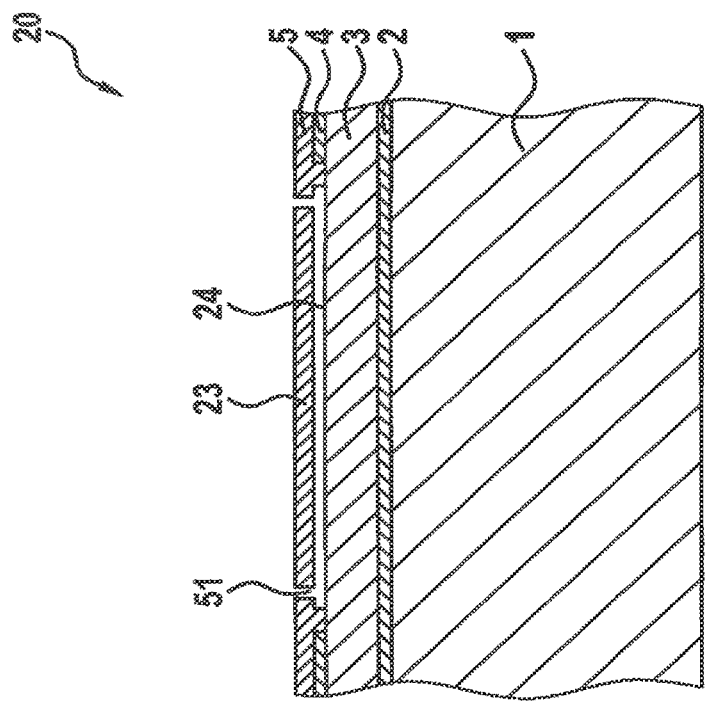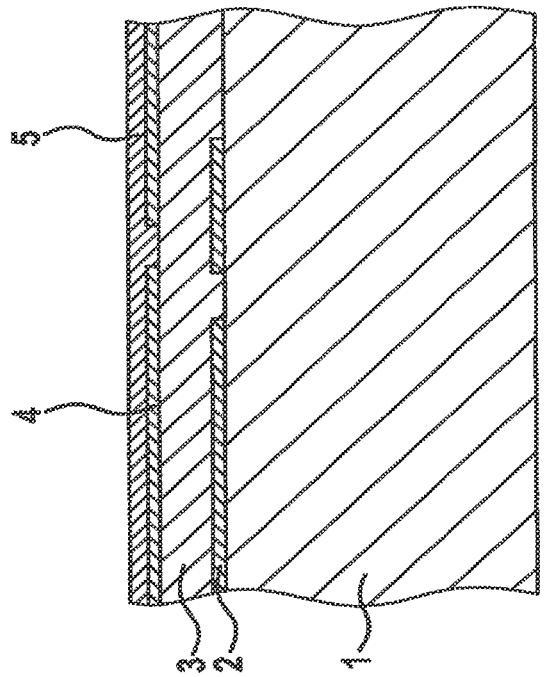

METHOD FOR MANUFACTURING A MICROPHONE STRUCTURE AND A PRESSURE SENSOR STRUCTURE IN THE LAYER STRUCTURE OF A MEMS ELEMENT

FIELD OF THE INVENTION

The present invention relates to a method for manufacturing at least one microphone structure and at least one pressure sensor structure in the layer structure of a MEMS element, in which the microphone structure and the pressure sensor structure are formed adjacent to one another in the layer structure, and at least one access opening each is created in the rear side of the element for the pressure sensor diaphragm and for the microphone diaphragm. Both in the case of the microphone function and in the case of the pressure sensor function, the signal detection is to be carried out capacitively. For that reason, the microphone structure includes a sound pressure-sensitive microphone diaphragm and a fixed acoustically permeable microphone counter-element, each of which is provided with at least one electrode of a microphone capacitor. The pressure sensor structure includes a pressure-sensitive pressure sensor diaphragm and a fixed pressure sensor counter-element, each of which is also provided with at least one electrode of a measuring capacitor.

BACKGROUND INFORMATION

The integration of a microphone function and a pressure sensor function in one shared MEMS chip contributes to the miniaturization of application boards and terminal equipment while simultaneously increasing the functional scope, which is increasingly gaining significance in the area of consumer electronics.

A component including a microphone function and a pressure sensor function, which is implemented in the form of a chip stack, is discussed in WO 2012/122872 A1.

This chip stack includes a MEMS element, the microphone structure including microphone diaphragm, acoustically permeable counter-element and microphone capacitor being formed in its layer structure, as well as the pressure sensor diaphragm including the deflectable electrode of the measuring capacitor. Two access openings are formed in the rear side of the MEMS element, one for the microphone structure and one for the pressure sensor diaphragm, the access openings being situated adjacent to one another in the layer structure of the MEMS element. Furthermore, the chip stack of the known component includes a cap wafer, which is mounted face-to-face on the MEMS element. In the layer structure of the cap wafer a recess is formed, which is situated above the microphone structure and forms a closed rear side volume for the microphone function. Moreover, a fixed counter-electrode is provided in the layer structure of the cap wafer, which is situated above the deflectable electrode of the pressure sensor structure and together with it, forms the measuring capacitor of the pressure sensor structure.

The component concept of WO 2012/122872 A1 provides for structuring the microphone diaphragm and the pressure sensor diaphragm from the same functional layer of the MEMS layer structure. The deflectable electrode of the pressure sensor structure is situated here on a carrier element, which is centrally and rigidly connected to the deflectable pressure sensor diaphragm. This carrier element is structured from the same functional layer as the counter-element of the microphone structure.

This component concept is believed to be problematic since the distance between the electrodes of the measuring capacitor of the pressure sensor structure is defined only within the scope of the assembly and packaging technology (APT), i.e., only when the MEMS element and the cap wafer are joined to one another. Generally, the electrodes of the measuring capacitor should have a certain predefined distance. This makes special demands on the APT of the component and is consequently connected with increased manufacturing expense. Moreover, this significantly increases the susceptibility to error of the manufacturing process.

SUMMARY OF THE INVENTION

In the present invention, a manufacturing method for a MEMS element is proposed, by which both the microphone structure including a microphone capacitor and the pressure sensor structure including a measuring capacitor are implemented in the MEMS layer structure. In the process, the individual components of the microphone structure and the pressure sensor structure are formed in parallel but independent of one another in the layers of the MEMS layer structure.

The method according to the present invention provides for structuring the pressure sensor diaphragm from a first layer, which functions as a base layer for the microphone diaphragm.

The fixed counter-electrode of the measuring capacitor is structured from an electrically conductive second layer which functions as a diaphragm layer of the microphone structure. The fixed pressure sensor counter-element is structured from a third and a fourth layer. This third layer functions in the area of the microphone structure as a sacrificial layer, the thickness of which determines the electrode distance of the microphone capacitor or the distance between the microphone diaphragm and the microphone counter-element, which is structured from the fourth layer.

Hence, the layer structure of the microphone structure is also used here for manufacturing the pressure sensor structure. According to the present invention, it has, however, been found that the individual layers in the context of the two structures situated adjacent to one another—microphone and pressure sensor—may fulfill different functions, as long as the layer material and the layer thickness are compatible with these different functions. According to the present invention, this is also utilized in order to define electrode distances of the microphone capacitor and the measuring capacitor independently of one another. It is a particular advantage that the method according to the present invention requires only slight modifications of the manufacturing process for MEMS microphone elements, and therefore makes it possible to manufacture integrated microphone pressure sensor elements very cost-effectively.

In principle, there are various options for implementing the manufacturing method according to the present invention, which are not least dependent on the geometric and acoustic or sensitivity requirements for the microphone and pressure sensor components of the MEMS elements to be manufactured.

Independent of these functional boundary conditions, it is an advantage to select an electrically conductive material for the first layer, i.e., the layer from which the pressure sensor diaphragm is structured. In this case, the pressure sensor diaphragm per se may then be utilized namely as a deflectable electrode of the measuring capacitor. Short circuits or leakage currents between the element structure and the substrate and within the element structure may then be prevented simply by dielectric intermediate layers. This is in particular important also in the area of the microphone structure, where this electrically conductive layer functions as a base layer for the microphone diaphragm. Polysilicon is in particular suitable as an electrically conductive layer material which also satisfies the mechanical requirements for a diaphragm layer, since it may be deposited and structured very simply and having a defined layer thickness, and moreover may be equipped with defined electrical properties by a suitable doping. The dielectric intermediate layers in this case may be formed from SiO2. SiO2 may be removed simply in areas from the layer structure in a sacrificial etching process, which proves to be advantageous in particular for the exposure of diaphragm structures.

For that reason, also in a specific embodiment of the present invention, the distance between the electrodes of the measuring capacitor of the pressure sensor structure is defined and established with the aid of at least one first sacrificial layer. This first sacrificial layer is generated above the first layer including the pressure sensor diaphragm and the base structure for the microphone diaphragm. Since the electrically conductive second layer, from which the fixed counter-electrode of the measuring capacitor is structured, is applied to the first sacrificial layer, its thickness in the area of the pressure sensor structure determines the electrode distance of the measuring capacitor. The sacrificial layer material is then removed from the diaphragm area of the pressure sensor structure, and specifically via etching access openings in the second layer.

At this point, it should be noted that the electrically conductive second layer in the area of the pressure sensor structure functions as a fixed counter-electrode of the measuring capacitor and is used as a support layer for the layer structure of the pressure sensor counter-element. In the area of the microphone structure, it is used as a diaphragm layer and forms here the deflectable electrode of the microphone capacitor.

Also in the case of the electrically conductive second layer, the layer is advantageously a polysilicon layer. SiO2 may also be used as material for the at least one first sacrificial layer and for the third layer, which functions in the area of the microphone structure as a sacrificial layer.

As has already been discussed above, there are various options for developing and refining the teaching of the present invention in an advantageous manner. For this purpose, reference is made on the one hand to the subordinated patent claims and on the other hand to the following description of one exemplary embodiment of the present invention.

BRIEF DESCRIPTION OF THE DRAWINGS

FIGS. 1a, 1b, 1c, 1d, 1e, 1f, 1g, 1h, 1i, 1j and 1k illustrate the manufacturing method according to the present invention. They each show a sectional representation through the MEMS layer structure in the area of the microphone structure—left partial image—and in the area of pressure sensor structure—right partial image—in consecutive stages of manufacture.

DETAILED DESCRIPTION

Figure 1C:
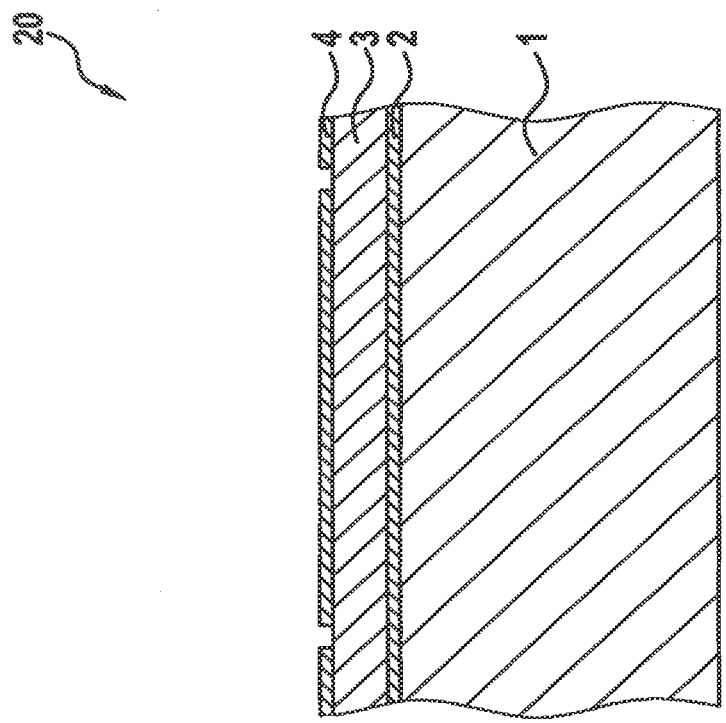
Figure 1C:
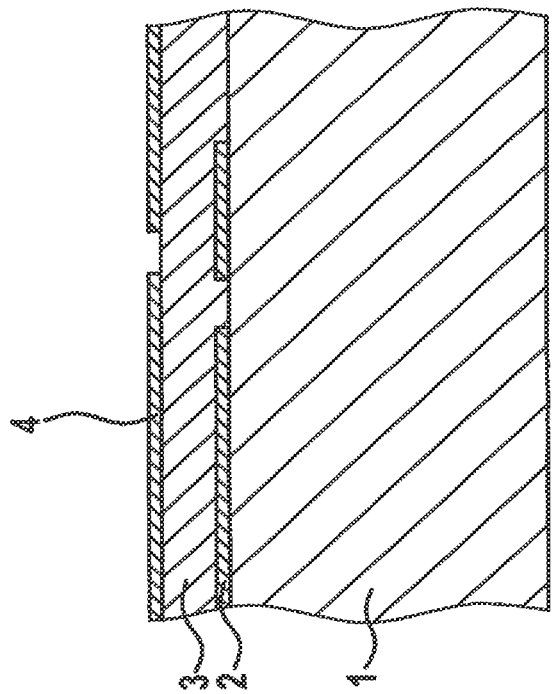

In the exemplary embodiment described here, microphone structure 10 and pressure sensor structure 20 of the MEMS element are implemented in a layer structure on base substrate 1. This base substrate may be, for example, a silicon substrate 1. The two partial images of FIGS. 1a through 1k illustrate that microphone structure 10 and pressure sensor structure 20 are situated adjacent to one another and are implemented independent of one another.

In a first process step—FIG. 1a—a silicon oxide layer 2 is deposited on the substrate surface and structured at least in the area of microphone structure 10. In the area of pressure sensor structure 20, silicon oxide layer 2 remains closed. This silicon oxide layer 2 is used on the one hand as an etch stop layer for a rear-side etching process, in which base substrate 1 is removed completely in defined areas in order to expose the microphone diaphragm and the pressure sensor diaphragm on the rear side. On the other hand, silicon oxide layer 2 functions as an electrical insulating layer between base substrate 1 and the layer structure including microphone structure 10 and pressure sensor structure 20.

A polysilicon layer 3 is applied to silicon oxide layer 2, which is shown in FIG. 1b. Polysilicon layer 3 is generally grown epitaxially. In this polysilicon layer 3, pressure sensor diaphragm 21 is implemented above a cavern 25 in a subsequent process step, the cavern functioning here as a deflectable electrode of the measuring capacitor; in the area of microphone structure 10, polysilicon layer 3 is used as a base layer.

In a next process step, another silicon oxide layer 4 is deposited on polysilicon layer 3. This silicon oxide layer 4 is denoted in the following as upper base oxide 4; in the area of pressure sensor structure 20, the thickness of base oxide 4 determines the distance between the area of polysilicon layer 3, which represents pressure sensor diaphragm 21, and pressure sensor counter-element 22 and consequently the electrode distance of the measuring capacitor. In the area of microphone structure 10, edge connection 12 of microphone diaphragm 11 is implemented to the layer structure with the aid of base oxide 4. Advantageously, the thickness of base oxide 4 is selected in such a way that the measuring capacitor maintains a defined electrode distance; however, the structural requirements of microphone structure 10 are also satisfied. The electrode distance of the measuring capacitor may, however, also be predefined largely independent of microphone structure 10, in that base oxide 4 is deposited in multiple oxide layers, which are differently structured. In this way, different layer thicknesses of base oxide 4 may be implemented in the area of pressure sensor structure 20 and in the area of microphone structure 10.

Base oxide 4 is subsequently structured once more overall, which is shown in FIG. 1c. Here, the area of pressure sensor structure 20 is defined on the one hand and the position of edge connection 12 of microphone diaphragm 11 is defined on the other hand.

FIG. 1d shows that another polysilicon layer 5 is deposited on thus structured base oxide 4. In this polysilicon layer 5, fixed counter-electrode 23 of the measuring capacitor of the pressure sensor structure is implemented. In the area of microphone structure 10, it is used as a diaphragm layer.

Figure 1E:
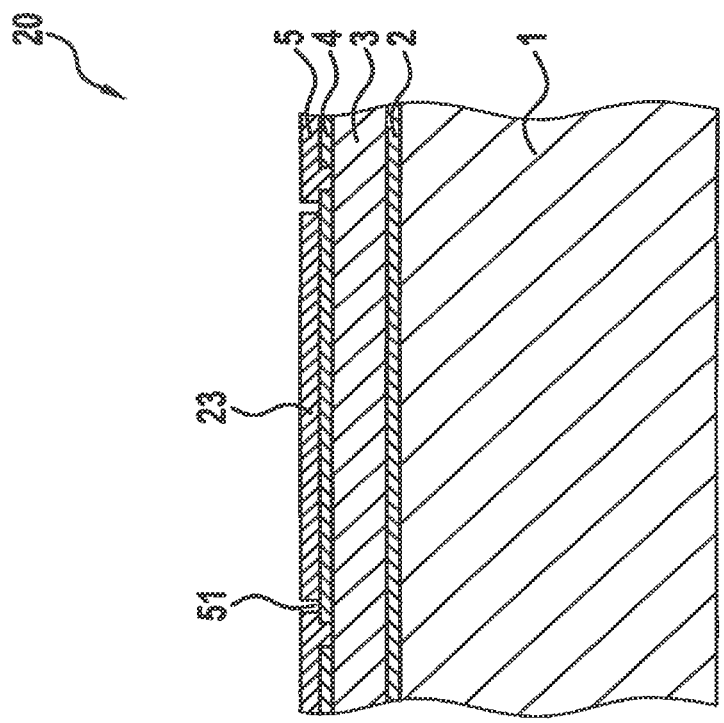
Figure 1E:
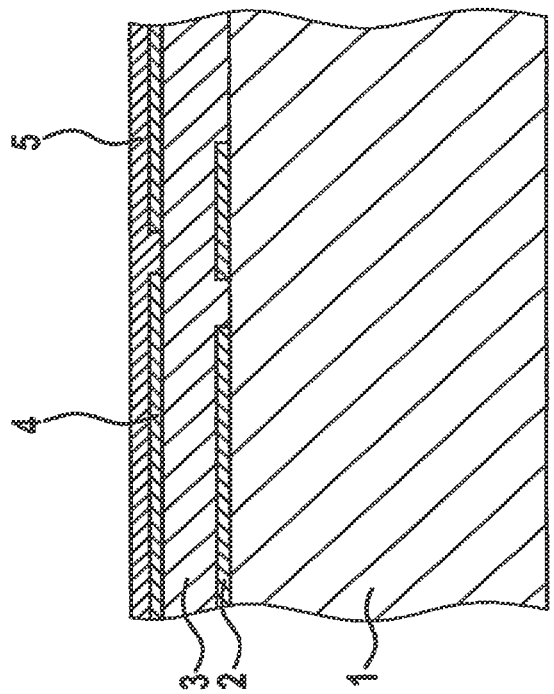

In a next process step, polysilicon layer 5 is structured, and specifically only in the area of pressure sensor structure 20, in order to define counter-electrode 23 of the measuring capacitor and generate etching access openings 51 to base oxide 4. The result of this structuring process is represented in FIG. 1e.

FIG. 1f shows the layer structure after a sacrificial etching process, in which base oxide 4 was removed from pressure sensor area 20. The etching attack takes place via etching access openings 51 wet chemically or by gas phase etching.

After the sacrificial layer etching, etching access openings 51 are resealed with the aid of LPCVD (low pressure chemical vapor deposition) of SiO2 52. Via the prevailing process conditions, in particular temperature and pressure, it is possible to set the reference pressure prevailing later in pressure cell 24 of pressure sensor component 20.

Figure 1G:
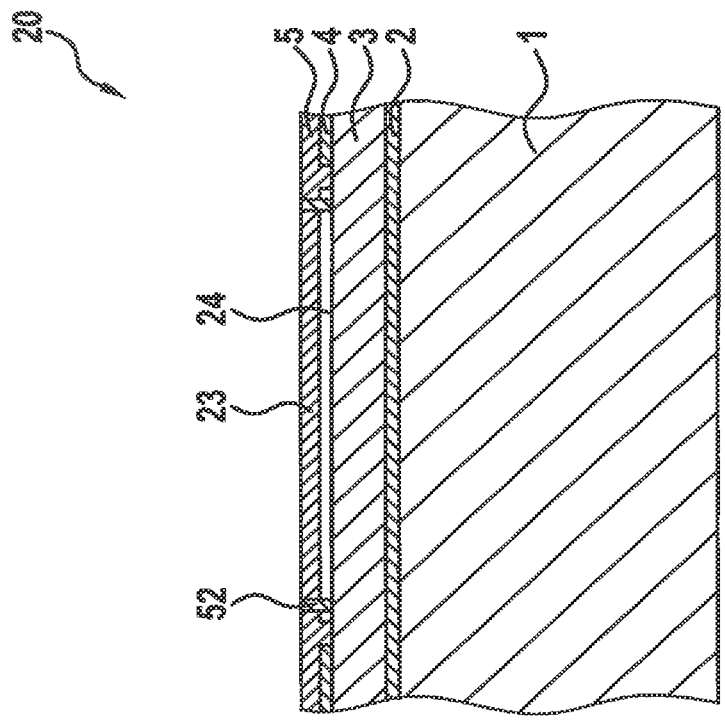
Figure 1G:
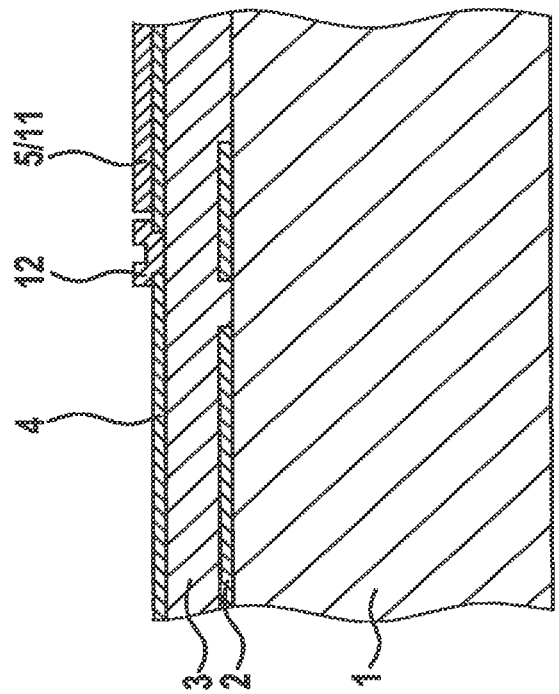

After pressure cell 24 is sealed, polysilicon layer 5 is structured in the area of microphone structure 10, in order to define microphone diaphragm 11 and its edge connection 12 to the layer structure. As FIG. 1g shows, the previously deposited LPCVD-SiO2 was initially removed for that purpose in the exemplary embodiment depicted here. However, it may also remain in the layer structure.

Figure 1H:
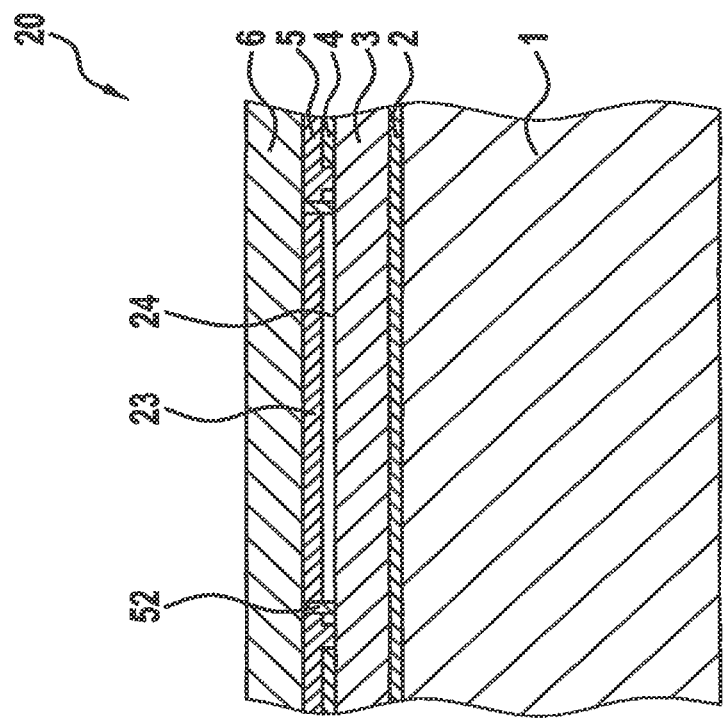
Figure 1H:
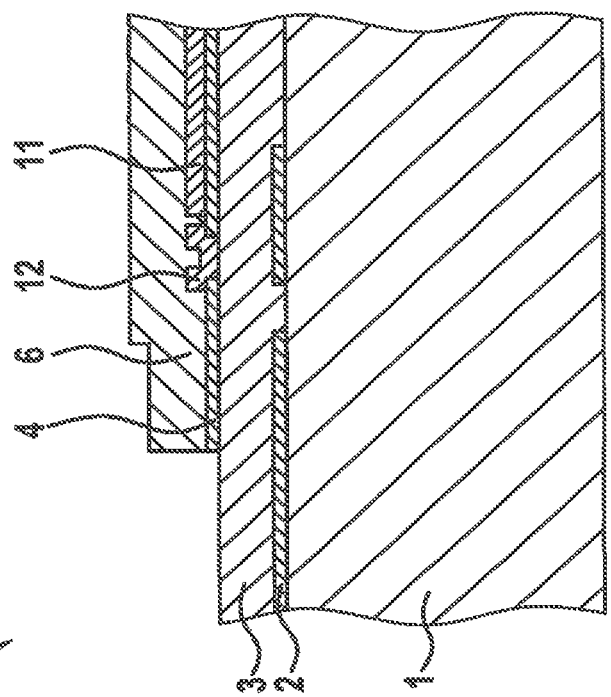

In a next process step—shown in FIG. 1h—a thick silicon oxide layer 6 is applied to polysilicon layer 5 and structured. In the area of microphone structure 10, polysilicon oxide layer 6 is used as a sacrificial layer, so that its thickness defines the distance between microphone diaphragm 11 and fixed microphone counter-element 13. In the area of pressure sensor structure 20, silicon oxide layer 6 is only structured in order to contact electrodes 21 and 23 of the measuring capacitor. Moreover, the mechanical stability of pressure sensor counter-element 22 may be increased by a structuring of silicon oxide layer 6.

Figure 1I:
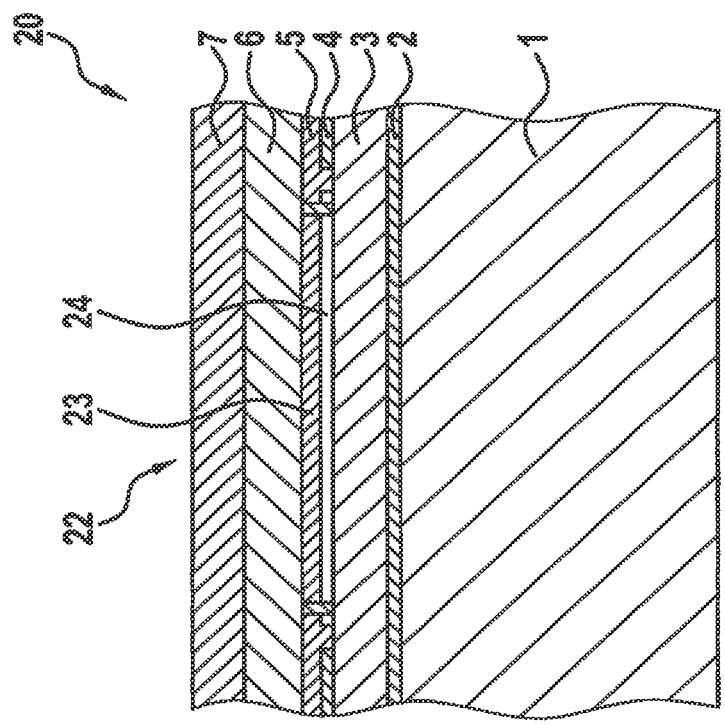
Figure 1I:
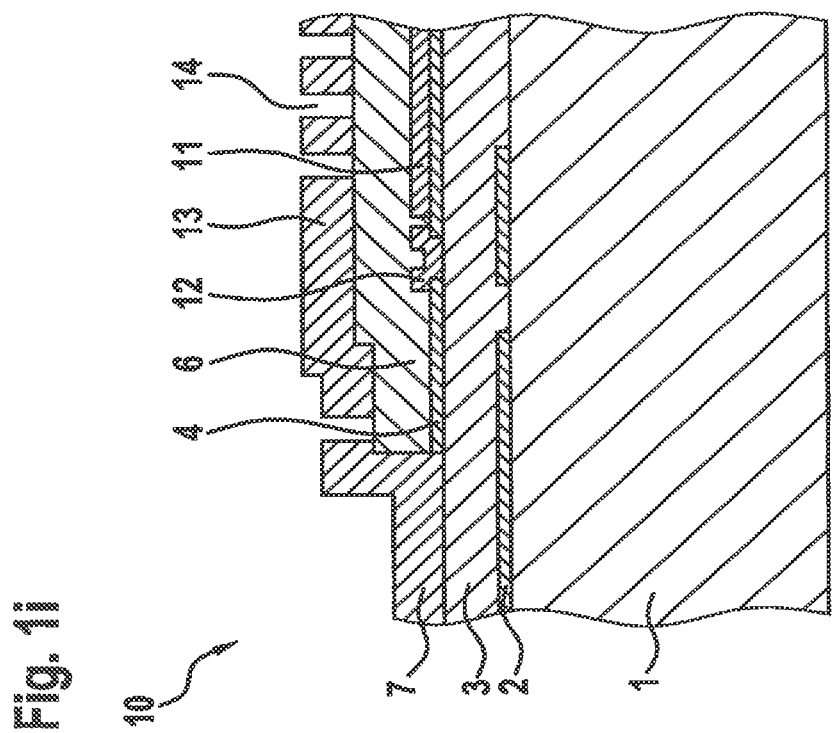

FIG. 1i shows the layer structure after another thick layer 7, in this case a polysilicon layer 7, has been deposited on structured silicon layer 6 and structured at least in the area of microphone structure 10. In the process, microphone counter-element 13 was generated including passage openings 14. This microphone counter-electrode 13 is used as a support for at least one fixed counter-electrode of the microphone capacitor, which is not depicted in detail here. In the area of pressure sensor 20, polysilicon layer 7 remains closed and, together with silicon oxide layer 6, forms pressure sensor counter-element 22 including pressure sensor counter-electrode 23 in polysilicon layer 5.

Figure 1J:
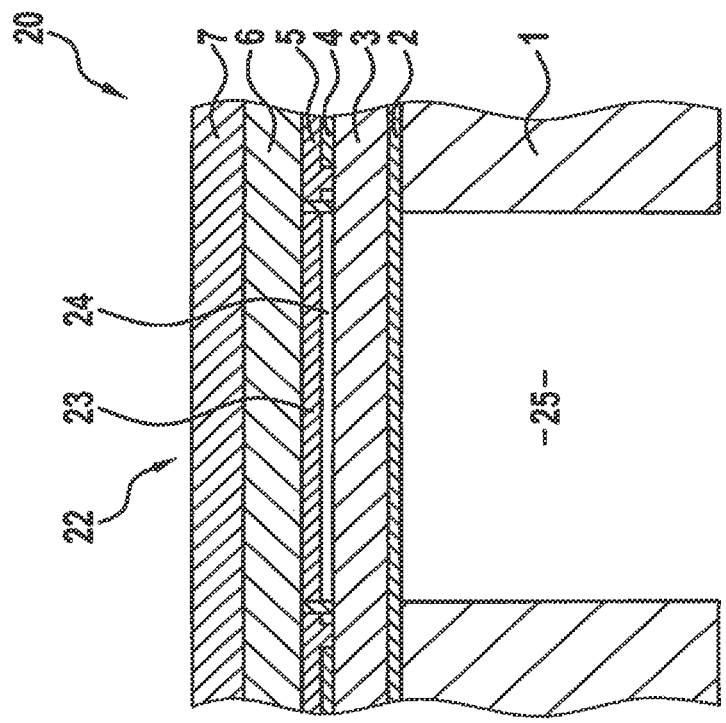
Figure 1J:
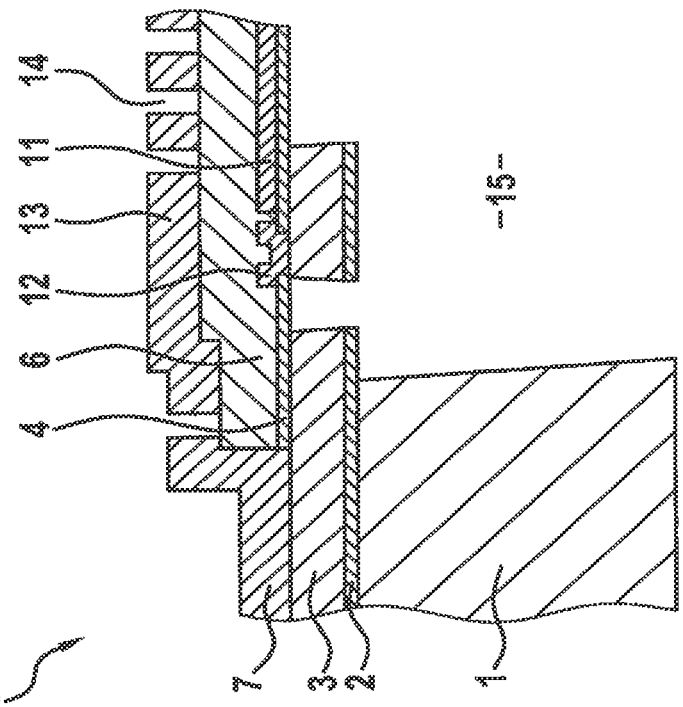

In a shared rear side etching process—in this case, a trench process—the rear sides of microphone diaphragm 11 and pressure sensor diaphragm 21 (made up of the part of polysilicon layer 3 which is located above cavern 25) are exposed. As shown in FIG. 1j, two caverns 15 and 25, which are independent from one another, are generated in the rear side of the substrate. In the case of microphone structure 10, the trench process stops on silicon oxide layer 2 and upper base oxide 4, while in the case of pressure sensor structure 20, the trench process stops exclusively on silicon oxide layer 2.

Figure 1K:
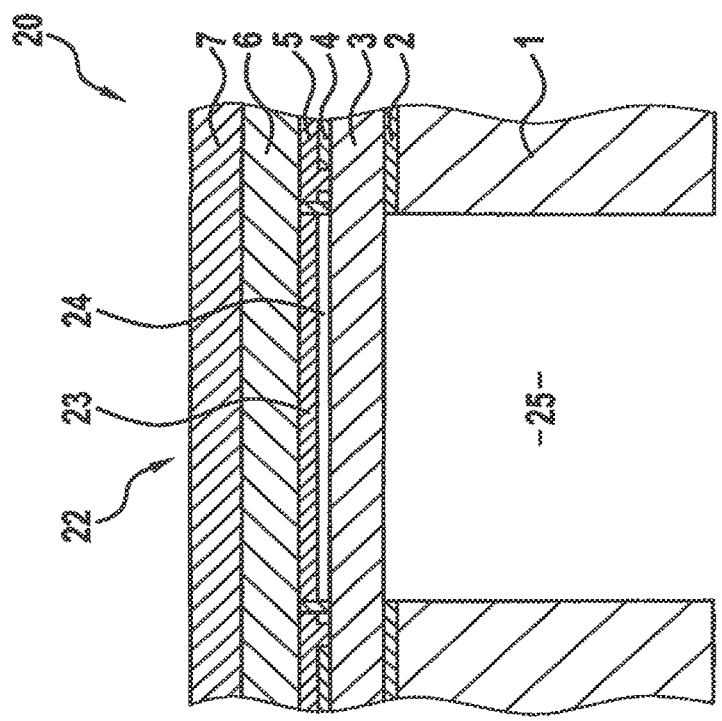
Figure 1K:
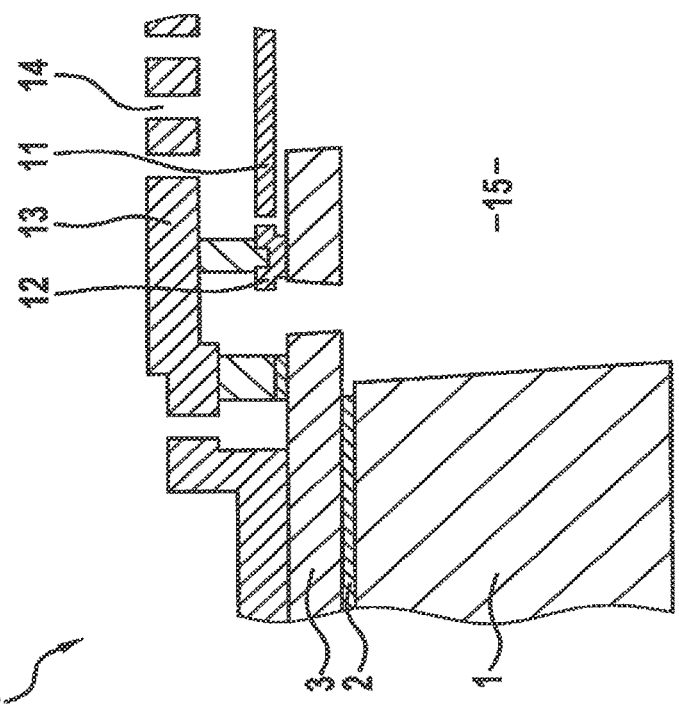

In a concluding sacrificial layer etching process, microphone diaphragm 11 is also exposed by removing silicon oxide layer 2, upper base oxide 4 and silicon oxide sacrificial layer 6 from the area of microphone structure 10. In the process, silicon oxide layer 2 is also removed from the area of pressure sensor structure 20. The result of this sacrificial layer etching process is represented in FIG. 1k.

The invention claimed is:

1. A method for manufacturing at least one microphone structure and at least one pressure sensor structure in a layer structure of a MEMS element, the method comprising:
   providing the microphone structure, which includes a sound pressure-sensitive microphone diaphragm and a fixed acoustically permeable microphone counter-element, each of which includes at least one electrode of a microphone capacitor;
   providing the pressure sensor structure, which includes a pressure-sensitive pressure sensor diaphragm and a fixed pressure sensor counter-element, each of which includes at least one electrode of a measuring capacitor,
   wherein the microphone structure and the pressure sensor structure are formed adjacent to one another in the layer structure; and
   providing at least one access opening in a rear side of the element of the microphone diaphragm and of the pressure sensor diaphragm;
   wherein the pressure sensor diaphragm is structured from a first layer, which functions as a base layer for the microphone diaphragm,
   wherein the fixed counter-electrode of the measuring capacitor is structured from an electrically conductive second layer, which functions as a diaphragm layer of the microphone structure, and
   wherein the fixed pressure sensor counter-element is structured from a third layer and a fourth layer, the third layer functioning in the area of the microphone structure as a sacrificial layer, the thickness of which in the area of the microphone structure determining the electrode distance of the microphone capacitor and the microphone counter-element is structured from the fourth layer.

2. The method of claim 1, wherein the first layer is formed from an electrically conductive material, so that the pressure sensor diaphragm functions as a deflectable electrode of the measuring capacitor.

3. The method of claim 1, wherein at least one first sacrificial layer is generated above the first layer, the thickness of the sacrificial layer in the area of the pressure sensor structure determining the electrode distance of the measuring capacitor; the electrically conductive second layer is applied to the first sacrificial layer and the first sacrificial layer is subsequently removed from the diaphragm area of the pressure sensor structure via etching access openings in the second layer.

4. The method of claim 1, wherein the first, the second and/or fourth layers are formed from polysilicon material.

5. The method of claim 1, wherein at least one sacrificial layer is formed from SiO2 material.

6. A MEMS element, comprising:
   at least one microphone structure; and
   at least one pressure sensor structure, wherein the microphone structure and the pressure sensor structure are formed adjacent to one another in the layer structure of the MEMS element;
   wherein the microphone structure includes a sound pressure-sensitive microphone diaphragm and a fixed acoustically permeable microphone counter-element, each of which includes at least one electrode of a microphone capacitor, and
   wherein the pressure sensor structure includes a pressure-sensitive pressure sensor diaphragm and a fixed pressure sensor counter-element, each of which includes at least one electrode of a measuring capacitor,
   wherein the pressure sensor diaphragm is structured from a first layer, which functions as a base layer for the microphone diaphragm,
   wherein the fixed counter-electrode of the measuring capacitor is structured from an electrically conductive second layer, which functions as a diaphragm layer of the microphone structure,
   wherein the fixed pressure sensor counter-element is structured from a third layer and a fourth layer, the third layer being removed in the area of the microphone structure, and the microphone counter-element being structured from the fourth layer, and wherein at least one access opening is formed in a rear side of the element of the microphone diaphragm and of the pressure sensor diaphragm.

* * * * *